(12) United States Patent
Katagiri et al.

(10) Patent No.: US 10,110,257 B2
(45) Date of Patent: *Oct. 23, 2018

(54) RECONSTRUCTIVE ERROR RECOVERY PROCEDURE (ERP) FOR MULTIPLE DATA SETS USING RESERVED BUFFER

(71) Applicant: International Business Machines Corporation, Armonk, NY (US)

(72) Inventors: Takashi Katagiri, Yokohama (JP); Pamela R. Nylander-Hill, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 754 days.

This patent is subject to a terminal disclaimer.

(21) Appl. No.: 14/199,911

(22) Filed: Mar. 6, 2014

(65) Prior Publication Data
US 2014/0189460 A1    Jul. 3, 2014

Related U.S. Application Data

(63) Continuation of application No. 13/676,493, filed on Nov. 14, 2012, now Pat. No. 8,793,552.

(51) Int. Cl.
*H03M 13/00* (2006.01)
*H03M 13/29* (2006.01)
*G11B 20/18* (2006.01)

(52) U.S. Cl.
CPC ..... *H03M 13/2957* (2013.01); *G11B 20/1833* (2013.01); *H03M 13/29* (2013.01);
(Continued)

(58) Field of Classification Search
CPC ............. H03M 13/2957; H03M 13/29; H03M 13/1515; H03M 13/2909; G11B 20/1833
(Continued)

(56) References Cited

U.S. PATENT DOCUMENTS

| | | | |
|---|---|---|---|
| 4,697,266 A | 9/1987 | Finley | |
| 5,247,523 A | 9/1993 | Arai et al. | |

(Continued)

FOREIGN PATENT DOCUMENTS

| | | |
|---|---|---|
| CN | 101101790 | 1/2008 |
| CN | 101611385 | 12/2009 |

(Continued)

OTHER PUBLICATIONS

Non-Final Office Action from U.S. Appl. No. 13/676,477 dated Dec. 24, 2013.
(Continued)

*Primary Examiner* — Albert Decady
*Assistant Examiner* — Enam Ahmed
(74) *Attorney, Agent, or Firm* — Zilka-Kotab, P.C.

(57) ABSTRACT

In one embodiment, a system includes a processor configured to execute logic, the logic being configured to read a plurality of data sets, each data set including a plurality of portions which combine together to wholly form the data set, and reread at least a first uncorrected data set using a different setting in an error recovery procedure (ERP) when an error in the first uncorrected data set is not correctable using C2-ECC or an error in any portion of the first uncorrected data set is not correctable using C1-ECC. Other systems and methods for reading data from tape using a reconstructive ERP to reduce backhitches are presented according to more embodiments.

20 Claims, 8 Drawing Sheets

(52) U.S. Cl.
CPC ..... *H03M 13/293* (2013.01); *H03M 13/2909* (2013.01); *G11B 2020/1853* (2013.01)

(58) Field of Classification Search
USPC .................................................. 714/755
See application file for complete search history.

(56) References Cited

U.S. PATENT DOCUMENTS

| | | | |
|---|---|---|---|
| 5,369,641 A * | 11/1994 | Dodt | G06F 3/0601 360/48 |
| 5,684,810 A | 11/1997 | Nakamura et al. | |
| 5,844,919 A | 12/1998 | Glover et al. | |
| 5,983,384 A * | 11/1999 | Ross | H03M 13/2975 714/755 |
| 5,996,105 A * | 11/1999 | Zook | H03M 13/29 714/755 |
| 6,624,958 B1 | 9/2003 | Alva | |
| 6,640,326 B1 | 10/2003 | Buckingham et al. | |
| 6,738,942 B1 | 5/2004 | Sridharan et al. | |
| 6,751,771 B2 | 6/2004 | Chuang et al. | |
| 6,757,848 B2 | 6/2004 | Bartlett | |
| 6,779,149 B1 | 8/2004 | Dong | |
| 6,862,149 B2 | 3/2005 | Maple et al. | |
| 6,920,005 B2 | 7/2005 | Yun | |
| 6,958,873 B2 | 10/2005 | Sved | |
| 7,188,299 B2 | 3/2007 | Nakagawa et al. | |
| 7,280,293 B2 | 10/2007 | Nylander-Hill et al. | |
| 7,624,328 B2 | 11/2009 | Unruh | |
| 7,840,872 B2 | 11/2010 | Andersen | |
| 7,965,462 B2 * | 6/2011 | Demura | G11B 20/1201 360/40 |
| 7,987,404 B2 | 7/2011 | Fukuda et al. | |
| 8,108,752 B2 | 1/2012 | Tanaka | |
| 8,209,693 B2 | 6/2012 | Matsuo | |
| 8,707,144 B2 * | 4/2014 | Wang | H03M 13/1108 714/752 |
| 8,793,552 B2 | 7/2014 | Katagiri et al. | |
| 8,810,944 B1 | 8/2014 | Katagiri et al. | |
| 9,053,748 B2 | 6/2015 | Katagiri et al. | |
| 9,104,576 B2 | 8/2015 | Katagiri et al. | |
| 9,141,478 B2 | 9/2015 | Katagiri et al. | |
| 9,564,171 B2 | 2/2017 | Katagiri et al. | |
| 9,582,360 B2 | 2/2017 | Katagiri et al. | |
| 9,583,136 B2 | 2/2017 | Katagiri et al. | |
| 9,590,660 B2 | 3/2017 | Katagiri et al. | |
| 2001/0037484 A1 * | 11/2001 | Paterson | G11B 20/1833 714/784 |
| 2002/0143985 A1 | 10/2002 | Goldstein | |
| 2002/0181356 A1 | 12/2002 | Watanabe et al. | |
| 2002/0194544 A1 | 12/2002 | Bartlett | |
| 2003/0066013 A1 | 4/2003 | Maple et al. | |
| 2004/0205442 A1 | 10/2004 | Chuang et al. | |
| 2005/0149819 A1 | 7/2005 | Hwang | |
| 2005/0207305 A1 | 9/2005 | Park | |
| 2008/0098280 A1 | 4/2008 | Andersen | |
| 2008/0155374 A1 | 6/2008 | Tanaka | |
| 2008/0222490 A1 | 9/2008 | Leung et al. | |
| 2008/0235556 A1 | 9/2008 | Eleftheriou et al. | |
| 2008/0320361 A1 * | 12/2008 | Fukuda | G11B 20/1803 714/755 |
| 2009/0287956 A1 | 11/2009 | Flynn et al. | |
| 2010/0146368 A1 * | 6/2010 | Chishti | G06F 11/1064 714/755 |
| 2010/0162083 A1 | 6/2010 | Chung et al. | |
| 2012/0002317 A1 | 1/2012 | Hirata et al. | |
| 2012/0206831 A1 | 8/2012 | Katagiri et al. | |
| 2013/0086422 A1 | 4/2013 | Huang et al. | |
| 2014/0136918 A1 | 5/2014 | Katagiri et al. | |
| 2014/0136919 A1 | 5/2014 | Katagiri et al. | |
| 2015/0026510 A1 | 1/2015 | Katagiri et al. | |
| 2015/0193303 A1 | 7/2015 | Katagiri et al. | |
| 2015/0193304 A1 | 7/2015 | Katagiri et al. | |
| 2015/0256205 A1 | 9/2015 | Katagiri et al. | |
| 2015/0302888 A1 | 10/2015 | Katagiri et al. | |
| 2015/0371676 A1 | 12/2015 | Katagiri et al. | |

FOREIGN PATENT DOCUMENTS

| | | |
|---|---|---|
| DE | 102007046789 A1 | 4/2008 |
| EP | 1758023 | 2/2007 |
| EP | 2199911 A1 | 6/2010 |
| EP | 2199911 B1 | 9/2010 |
| WO | WO2008109586 | 9/2008 |

OTHER PUBLICATIONS

Notice of Allowance and Fee(s) Due from U.S. Appl. No. 13/676,493 dated Jan. 10, 2014.
Notice of Allowance and Fee(s) Due from U.S. Appl. No. 13/943,674 dated Feb. 19, 2014.
International Search Report from PCT Application No. PCT/CN2013/084934 dated Jan. 16, 2014.
U.S. Appl. No. 13/676,493, filed Nov. 14, 2012.
U.S. Appl. No. 13/676,477, filed Nov. 14, 2012.
U.S. Appl. No. 13/943,674, filed Jul. 16, 2013.
U.S. Appl. No. 14/149,752, filed Jan. 7, 2014.
U.S. Appl. No. 14/149,758, filed Jan. 7, 2014.
Final Office Action from U.S. Appl. No. 14/285,271, dated Jan. 30, 2015.
Notice of Allowance from U.S. Appl. No. 13/676,477, dated Feb. 2, 2015.
Notice of Allowance from U.S. Appl. No. 14/285,271, dated Apr. 7, 2015.
Notice of Allowance from U.S. Appl. No. 14/149,752, dated May 20, 2015.
Corrected Notice of Allowability from U.S. Appl. No. 14/285,271, dated May 20, 2015.
Katagiri et al., U.S. Appl. No. 14/720,703, filed May 22, 2015.
Katagiri et al., U.S. Appl. No. 14/752,923, filed Jun. 27, 2015.
Examination Report from United Kingdom Application No. GB1509708.2, dated Jul. 14, 2015.
Corrected Notice of Allowability from U.S. Appl. No. 14/149,752, dated Aug. 3, 2015.
Katagiri et al., U.S. Appl. No. 14/838,317, filed Aug. 27, 2015.
Non-Final Office Action from U.S Appl. No. 14/720,703, dated Oct. 7, 2015.
Non-Final Office Action from U.S. Appl. No. 14/752,923, dated Oct. 29, 2015.
Non-Final Office Action from U.S. Appl. No. 14/149,758, dated Nov. 10, 2015.
Notice of Allowance and Fee(s) Due from U.S. Appl. No. 13/676,493 dated Mar. 14, 2014.
Notice of Allowance and Fee(s) Due from U.S. Appl. No. 13/943,674 dated Apr. 4, 2014.
Final Office Action from U.S. Appl. No. 13/676,477 dated Jul. 18, 2014.
Non-Final Office Action from U.S. Appl. No. 14/285,271 dated Jul. 21, 2014.
Notice of Allowance from U.S. Appl. No. 13/676,477, dated Oct. 29, 2014.
U.S. Appl. No. 14/285,271, filed May 22, 2014.
Corrected Notice of Allowability from U.S. Appl. No. 14/149,752, dated Jul. 9, 2015.
Final Office Action from U.S. Appl. No. 14/752,923, dated May 5, 2016.
Final Office Action from U.S. Appl. No. 14/720,703, dated Jun. 8, 2016.
Office Action from German Application No. 112013005453.1, dated Jan. 14, 2016.
Examination Report from United Kingdom Application No. GB1509708.2, dated Feb. 9, 2016.
Notice of Allowance from U.S. Appl. No. 14/752,923, dated Jul. 13, 2016.
Notice of Allowance from U.S. Appl. No. 14/720,703, dated Aug. 31, 2016.
Notice of Allowance from U.S. Appl. No. 14/149,758, dated Sep. 9, 2016.

(56) References Cited

OTHER PUBLICATIONS

Notice of Allowance from U.S. Appl. No. 14/838,317, dated Sep. 22, 2016.
Notice of Allowance from U.S. Appl. No. 14/752,923, dated Oct. 13, 2016.
Notice of Allowance from U.S. Appl. No. 14/149,758, dated Oct. 17, 2016.
Notice of Allowance from U.S. Appl. No. 14/720,703, dated Oct. 25, 2016.
Corrected Notice of Allowance from U.S. Appl. No. 14/838,317, dated Nov. 21, 2016.
Corrected Notice of Allowance from U.S. Appl. No. 14/720,703, dated Nov. 17, 2016.
Corrected Notice of Allowance from U.S. Appl. No. 14/752,923, dated Nov. 18, 2016.
Non-Final Office Action from U.S. Appl. No. 14/838,317, dated Apr. 5, 2016.

* cited by examiner

RECONSTRUCTIVE ERROR RECOVERY PROCEDURE (ERP) FOR MULTIPLE DATA SETS USING RESERVED BUFFER

RELATED APPLICATIONS

This application is a continuation of copending U.S. patent application Ser. No. 13/676,493, filed Nov. 14, 2012, which is herein incorporated by reference.

BACKGROUND

The present invention relates to data storage, and more particularly, to reading data from tape using a reconstructive error recovery procedure (ERP) to reduce backhitches while reading data.

Tape and optical storage devices use very powerful error correction codes, such as product codes or concatenated codes, in conjunction with interleaving to provide a very high degree of data integrity. These error correction schemes typically use two error correction codes (ECCs) as component codes. Two important burst-error performance measures for tape storage systems protected by these schemes are: 1) lateral width of an erroneous stripe which is still capable of being corrected (this is also known as "broken track correction" capability), and 2) longitudinal width of an erroneous stripe that is still capable of being corrected. A "broken" track generally refers to a track that cannot be read correctly due to a problem on the media itself and/or a problem with the readback channel, e.g., as a channel that does not detect data correctly because of alignment or some systematic problem with the head.

When a tape drive reads data from a tape, or when a tape drive writes data to a tape, a unit of data that is read or written is referred to as a "data set." The data set is encoded using interleaved sets of codewords that are organized into an ECC-encoded matrix of size M bytes×N bytes (M×N) and then written to tape as shown in FIG. 1, according to the prior art. There are two levels of encoding within this matrix 150. The first level of encoding utilizes the matrix rows 102. Each row 102 of the matrix contains C1-ECC row parity 106, which adds p-bytes of C1-ECC to the n-bytes of user data (e.g., N=n+p bytes). The second level of encoding, C2-ECC column parity 108, adds q-bytes of C2-ECC to each matrix column 104. For example, if q=12, then adding 12 bytes of C2-ECC would add 12 rows to the matrix 150 (e.g., M=m+q bytes).

When the data set is read from the tape in a high error rate condition, C1/C2 ECC is not capable of correcting the read data. For example, in some approaches, C1-encoding is capable of correcting 10 bytes of error, and C2-encoding is capable of correcting 20 bytes of error. If the error bytes exceed this correction power, then data cannot be read from the tape. In this scenario, the tape drive will then attempt ERP to read the data set from the tape again with a different hardware setting (e.g., changing the tape speed). ERP repeats until C1/C2-encoding is able to correct the data or until the ERP retry count exceeds a threshold. If the retry count exceeds the threshold, then the tape drive will report a permanent error for the read operation.

There are several problems with this conventional approach. First, if the error rate is consistently high, C1 and C2 cannot correct the data and the tape drive fails to read the data set, which is extremely undesirable. Second, in areas of tape where the error rate is high due to media damage, marginal writing, data written in older formats, etc., the drive may fail to read. Third, in these cases, often many data sets in proximity may require ERP. If a dataset error is recoverable with many retries (many iterations of ERP), the next data set may presumably require similar retries to successfully read the data. All this recovery causes the tape drive to take a long time to read data due to the multiple backhitches necessary to reread the data from the tape, which degrades host performance and can also further damage media.

Accordingly, it would be beneficial to have a data recovery procedure that increases the efficiency of reading stored data from the tape.

BRIEF SUMMARY

In one embodiment, a system includes a processor configured to execute logic, the logic being configured to read a plurality of data sets, each data set including a plurality of portions which combine together to wholly form the data set, and reread at least a first uncorrected data set using a different setting in an error recovery procedure (ERP) when an error in the first uncorrected data set is not correctable using C2-error correction code (ECC) or an error in any portion of the first uncorrected data set is not correctable using C1-ECC.

In another embodiment, a tape drive includes a data buffer having a reserved data buffer, a processor configured to execute logic, the logic being configured to read an initial error data set followed by a plurality of data sets subsequent to the initial error data set once or more using different settings until: all rows of the initial error data set are assembled in a reserved data buffer and no uncorrectable errors remain, or at least one uncorrectable data set remains in a plurality of assembled data sets, or a maximum number of rereads has been reached, and after each rereading of the initial error data set and one or more of the plurality of data sets subsequent to the initial error data set in the same forward motion, store rows of each data set which either have no errors or are correctable using C1-ECC to their respective reserved data buffer areas, unless a matching row already exists in the reserved data buffer that has fewer corrected errors therein.

According to another embodiment, a method for reading data includes reading a plurality of data sets, each data set including a plurality of portions which combine together to wholly form the data set, and rereading at least a first uncorrected data set using a different setting in an ERP when an error in the first uncorrected data set is not correctable using C2-ECC or an error in any portion of the first uncorrected data set is not correctable using C1-ECC, wherein the first uncorrected data set is positioned prior to any other uncorrected data set in a read direction.

Other aspects and embodiments of the present invention will become apparent from the following detailed description, which, when taken in conjunction with the drawings, illustrates by way of example the principles of the invention.

DETAILED DESCRIPTION

Figure 1:
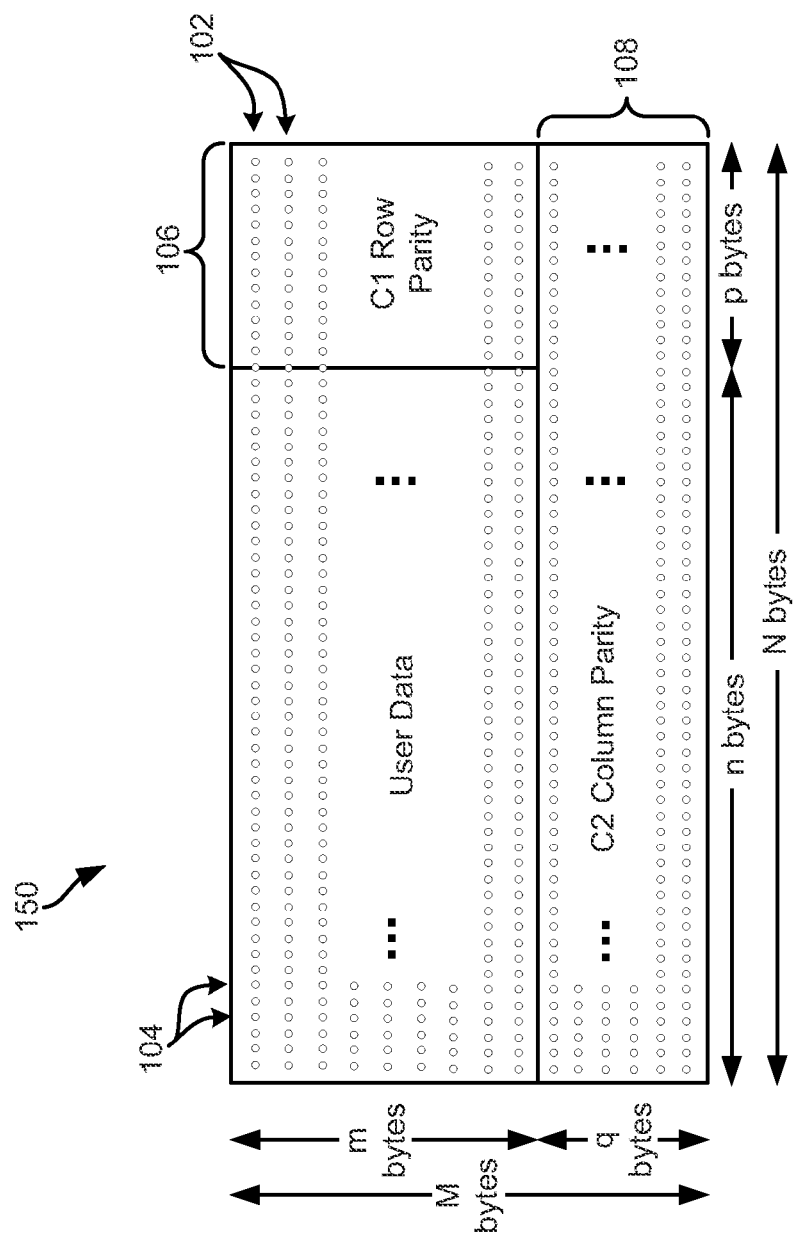
FIG. 1 shows a data set matrix or array, according to the prior art.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In one general embodiment, a system for reading data from a medium includes logic adapted to read a plurality of data sets from a medium one or more times, each data set including a plurality of portions which combine together to wholly form the data set, wherein during each read of at least one of the plurality of data sets, settings are changed in an attempt to better read the at least one of the plurality of data sets from the medium; logic adapted to store one or more of the portions of at least one of the plurality of data sets to a reserved data buffer when the one or more portions are correctable using C1-error correction code (ECC) to form one or more stored portions; logic adapted to aggregate, for each of the plurality of data sets that have all portions thereof stored to the reserved data buffer, all stored portions thereof to form one or more assembled data sets; logic adapted to determine whether C2-ECC is capable of correcting all errors in the one or more assembled data sets; logic adapted to correct any remaining errors in the one or more assembled data sets using C2-ECC to form one or more corrected data sets, and sending the one or more corrected data sets to a host when C2-ECC is capable of correcting all errors in the one or more assembled data sets; and logic adapted to reread at least a first uncorrected data set from the medium using a different setting in an error recovery procedure (ERP) when an error in the first uncorrected data set is not correctable using C2-ECC or an error in any portion of the first uncorrected data set is not correctable using C1-ECC, wherein the first uncorrected data set is positioned prior to any other uncorrected data set on the medium in a read direction.

In another general embodiment, a tape drive includes a data buffer including a reserved data buffer; logic adapted to read an initial error data set followed by a plurality of data sets subsequent to the initial error data set from a medium once or more using different settings until: all rows of the initial error data set are assembled in a reserved data buffer and no uncorrectable errors remain, or at least one uncorrectable data set remains in a plurality of assembled data sets, or a maximum number of rereads has been reached; logic adapted to, after each rereading of the initial error data set and one or more of the plurality of data sets subsequent to the initial error data set in the same forward motion, store rows of each data set which either have no errors or are correctable using C1-ECC to their respective reserved data buffer areas, unless a matching row already exists in the reserved data buffer that has fewer corrected errors therein; logic adapted to assemble the initial error data set from the rows stored for the initial error data set in the reserved data buffer to form an initial assembled data set; logic adapted to correct any remaining errors in the initial assembled data set using C2-ECC to form an initial reconstructed data set; and logic adapted to send the initial reconstructed data set to a host and/or store the initial reconstructed data set to a memory.

According to another general embodiment, a method for reading data from a medium includes reading a plurality of data sets from a medium one or more times, each data set including a plurality of portions which combine together to wholly form the data set, wherein during each read of at least one of the plurality of data sets, settings are changed in an attempt to better read the at least one of the plurality of data sets from the medium; storing one or more of the portions of at least one of the plurality of data sets to a reserved data buffer when the one or more portions are correctable using C1-ECC to form one or more stored portions; aggregating, for each of the plurality of data sets that have all portions thereof stored to the reserved data buffer, all stored portions thereof to form one or more assembled data sets; determining whether C2-ECC is capable of correcting all errors in the one or more assembled data sets; correcting any remaining errors in the one or more assembled data sets using C2-ECC to form one or more corrected data sets, and sending the one or more corrected data sets to a host when C2-ECC is capable of correcting all errors in the one or more assembled data sets; and rereading at least a first uncorrected data set from the medium using a different setting in an ERP when an error in the first uncorrected data set is not correctable using C2-ECC or an error in any portion of the first uncorrected data set is not correctable using C1-ECC, wherein the first uncorrected data set is positioned prior to any other uncorrected data set on the medium in a read direction.

In yet another general embodiment, a method for reading data from a medium includes reading an initial error data set followed by a plurality of data sets subsequent to the initial error data set from a medium once or more using different settings until: all rows of the initial error data set are assembled in a reserved data buffer and no uncorrectable errors remain, or at least one uncorrectable data set remains in a plurality of assembled data sets, or a maximum number of rereads has been reached; after each rereading of the initial error data set and one or more of the plurality of data sets subsequent to the initial error data set in the same forward motion, storing rows of each data set which either have no errors or are correctable using C1-ECC to their respective reserved data buffer areas, unless a matching row already exists in the reserved data buffer that has fewer corrected errors therein; assembling the initial error data set from the rows stored for the initial error data set in the reserved data buffer to form an initial assembled data set; correcting any remaining errors in the initial assembled data set using C2-ECC to form an initial reconstructed data set; and sending the initial reconstructed data set to a host and/or storing the initial reconstructed data set to a memory.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2A:
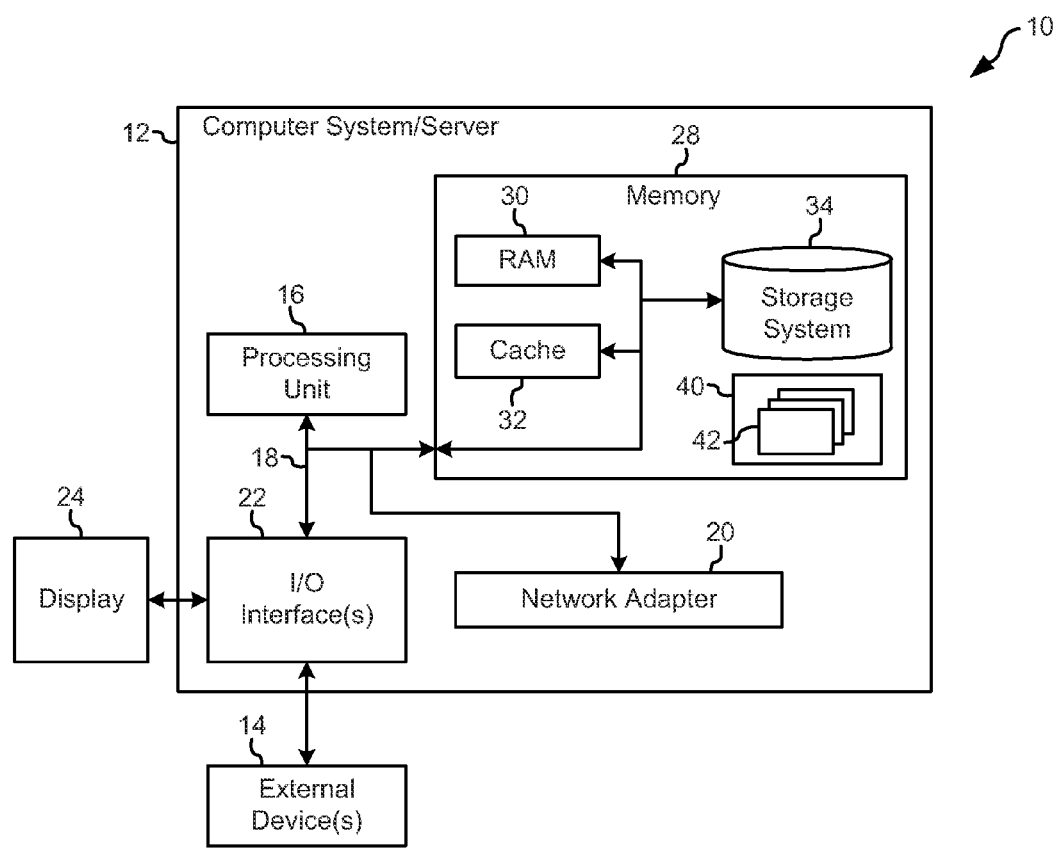
FIG. 2A illustrates a network storage system, according to one embodiment.

Referring now to FIG. 2A, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 2A, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2B:
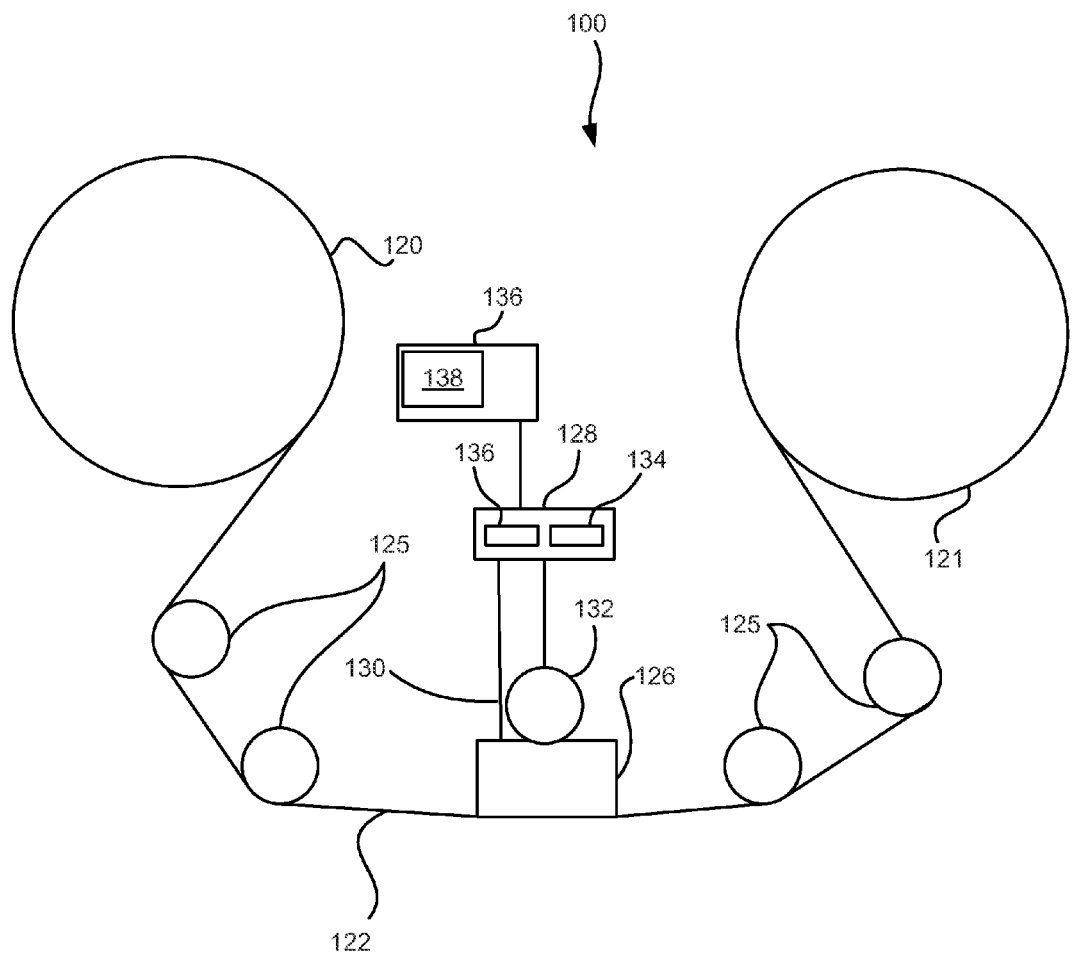
FIG. 2B illustrates a simplified tape drive of a tape-based data storage system, according to one embodiment.

FIG. 2B illustrates a simplified tape drive 100 of a tape-based data storage system, which may be employed according to various embodiments. While one specific implementation of a tape drive is shown in FIG. 2B, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 2B, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 2B) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

In one embodiment, the tape drive 100 may comprise a data buffer 136 which is accessible by the tape drive 100 and the controller 128. This data buffer 136 may be split into one or more sections, with one section being a reserved data buffer 138 to be used for storage of partial data sets during reading operations from the tape 122.

An interface may also be provided for communication between the tape drive 100 and a host (integral or external)

to send and receive the data and for controlling the operation of the tape drive 100 and communicating the status of the tape drive 100 to the host, as would be understood by one of skill in the art.

Various types of error correction code (ECC) schemes are used in data storage to achieve very low bit error rates, e.g., magnetic tape and optical storage products are designed to ensure bit error rates in the range of $1 \times 10^{-17}$ to $1 \times 10^{-19}$ under normal operating conditions. Linear block codes, such as Reed-Solomon (RS) codes and low-density parity-check (LDPC) codes, have generally been preferred ECC schemes used in data storage products.

According to one embodiment, a reconstructive data recovery method uses a reserved data buffer portion of a tape drive's data buffer to store data from repeated data set read recovery attempts. The encoded data is reconstructed iteratively as error recovery procedure (ERP) repeats data set re-read from a tape to the reserved data buffer.

After each read of data from the tape, it may be determined which rows, each row including C1-encoded data, are satisfactory (referred to as good C1 rows) and which are not. This determination may be based on whether the C1 row has no errors or if the errors are correctable using C1-ECC. In the first read, all rows are stored to the reserved data buffer regardless of the quality of the read. However, in each subsequent read of the data from the tape, only those C1 rows which are better than a C1 row already stored to the reserved data buffer is written to the reserved data buffer in order to replace the C1 row currently stored thereto. In one embodiment, the C1 rows may be stored to the reserved data buffer after an ERP retry step has completed (e.g., one reread of data from the tape).

According to one scenario, when the error occurs randomly between each of the ERP retry steps, then different C1 rows will be uncorrectable in each ERP reread. Accordingly, by aggregating good C1 rows in the reserved data buffer, a complete data read with good C1 rows will be assembled in the reserved data buffer through repeated ERP retry steps. In contrast, with conventional methods, each reread would be analyzed separately, and regardless of the good C1 rows that are present, when a sufficient number of bad C1 rows are read, the entire data set will be deemed to be uncorrectable and another ERP retry step will be performed. With the present method, each reread can accumulate good C1 rows in the reserved data buffer, and when C2-ECC is subsequently able to correct the data, then the error is recovered, the ERP retry steps will cease, and the entire reconstructed data set will be copied from the reserved data buffer and sent to the host.

By utilizing the methods described herein according to various embodiments to read data from a tape, it is possible to recover errors even though there is no hardware setting that is capable of reading the data from the tape in a recoverable state in a single retry. This is because the methods described herein use multiple retry steps and store recoverable data from each reread in the reserved data buffer in order to assemble an entire data set which is then recoverable. For example, if a first hardware setting is effective to read the data for a first half of the data set, and a second hardware setting is effective to read the data for a second half of the data set, the methods described herein are capable of recovering the error using two retries that apply these two different hardware settings, whereas a conventional method would not be able to read the data in these two retries. This is because, according to current methods, at least a third hardware setting, or even more hardware settings in some instances, would be required to read the data for the entire data set. When there is no single hardware setting capable of reading the entire data set, then with conventional methods, the data set would not be capable of being read.

Therefore, by using the methods described herein according to various embodiments, the elapsed time used for ERP is reduced, since good C1 rows assessed after each reread with different hardware settings (an ERP retry) are accumulated in the reserved data buffer, and then assembled to reconstruct the entire data set. In this fashion, the number of repeated ERP retries may all contribute to recovering the error and lead to quicker read data recovery. Using current methods, unless the data read from the tape in a single ERP retry has fewer error bytes than the allowed C1/C2 threshold, the data set cannot be recovered. Accordingly, using conventional methods, ERP retries are repeated multiple times until the drive finds a suitable hardware setting to read the error data set completely in a single reread attempt. For example, in the scenario described above, if a first hardware setting is effective to read the data for a first half of the data set, and a second hardware setting is effective to read the data for a second half of the data set, conventional methods are not capable of recovering the error using these two retries that apply these two different hardware settings, and instead must try at least a third hardware setting. If this setting is not capable of recovering the error for the entire data set, then a fourth or more hardware setting must be tried. By this process, it can be shown that conventional methods would not be able to read such a data set successfully in a single reread despite a series of modified hardware settings. This adds to the amount of time to recover the error for the entire data set over what is possible using the methods described herein.

Data sets are written on tape, and each data set has a number (data set number) which is assigned to it sequentially from the beginning of the tape. For example, when the tape drive attempts to read data set #N (DS#N), DS#N can either be read without errors, be read with errors that are correctable with C1/C2-ECC, or cannot be read due to high error count (e.g, C1/C2-ECC cannot correct the errors). Even if all data cannot be recovered by C1/C2-ECC, some good C1 rows may still be read from the tape, and these good C1 rows may be stored from the tape to the reserved data buffer on the tape drive. Following the first read retry from tape, all C1 rows may be stored to the reserved data buffer, in one approach.

Each C1 row has the information which identifies the data set number from which the C1 row was read (which data set the C1 row belongs to), and the tape drive may use this to check the validity of the C1 row (DS#N or not). If the C1 row is for DS#N, then the syndrome of the C1 row may be checked in another approach, and this syndrome may indicate whether or not the error is recoverable via C1-ECC correcting power. After so verified, the tape drive copies this C1 row to the reserved data buffer area. When the next ERP also attempts to read DS#N from the tape, the validity check of C1 row and the data set number are already completed, which saves time. If there are new good C1 rows, these new good C1 rows are also copied (aggregated) in the reserved data buffer. If a sufficient number of C1 rows are so aggregated, the drive then attempts to correct the data via C2-ECC. If C2-ECC is able to correct all the error in the aggregated C1 rows, this indicates that the tape drive has successfully reconstructed an entire data set and the tape drive may then transfer this data set to the host.

In areas of tape where the error rate is high due to media damage, marginal writing, data written in older formats, etc., the drive may fail to read many data sets in the vicinity of that area of tape. This is considered an error burst. In these cases, the same recovery procedures are often successful for each of the problem data sets; however, with current methods, each problem data set is recovered singly, in numeric sequence, without regard for successful recovery of previous data sets. Therefore, if each recovery session on each data set requires many retries (many iterations of ERP), then it will take the tape drive a long time to successfully read data in this region of tape due to the multiple backhitches necessary to reread a single data set from the tape. This degrades host performance and can also further damage media.

According to one embodiment, when certain criteria have been met (e.g., detection of an error burst or particular cartridge type) then a reconstructive data recovery method may be applied to multiple data sets in a single read (e.g., all read at the same time during one ERP session, in a single action, in the same forward motion, etc.). This ERP method may be performed for multiple data sets that immediately follow the initial error data set during the same ERP retry, and effectively recover multiple data sets without requiring that each data set be read or reread in a different ERP session. Usually, a drive does not attempt to recover multiple data sets in the same forward motion; instead, it is normal to recover defects in one data set before progressing to the next data set. This is because if a data set cannot be recovered by ERP (e.g., it has too many uncorrectable errors), then it is assumed that the next data set(s) also may not be recoverable. For this reason, it is typically assumed that there is no reason to continue reading past a defective data set in the same forward motion, according to conventional methods.

However, in situations where reconstructive data recovery is deemed effective, according to one embodiment a reconstructive data recovery ERP is able to store and accumulate "good" C1 rows for multiple data sets at the same time (e.g., during the same ERP step). Once the initial error data set is capable of being recovered using accumulated data, then that reconstructed data set may be transferred to the host. At that time, the group of data sets that have been accumulating good C1 rows into their respective reserved data buffers with each retry of the initial error data set are analyzed. The drive may then detect that the next data set, a data set somewhere in the middle of the group of data sets, or the last data set of the multiple data sets also has a defect or error. If so, then the good C1 rows that have already accumulated into their respective reserved data buffer areas are checked to see if there are sufficient good C1 rows which can be used, immediately, to correct the subsequent data sets without further ERP (and backhitches).

The first data set within the group of multiple data sets that was not read successfully or cannot be reconstructed from accumulated data will cause a second ERP session to begin. This second ERP session marks this new error data set as the initial error data set, and subsequent backhitch and read retry may also cause reading of multiple subsequent datasets in the same forward motion. This method is particularly effective in reducing backhitches, for two reasons. First, if all of the multiple data sets can be read successfully, then the drive can restart motion following the last data set. Second, if a second ERP session is needed to be performed for a data set somewhere within the multiple data sets, then the drive need only reposition to the particular data set, not to the initial error dataset. This method is able to significantly reduce the amount of time needed to recover data in an area of tape with high error rates as compared to conventional methods.

If recovery on the initial error data set is ongoing, then the reconstructive ERP method described herein according to various embodiments is attempted for multiple data sets during the same ERP retry. The total elapsed time to read the multiple data sets will be less than the total time needed with a conventional method where the medium is backhitched for each ERP retry on a single data set until it is read, and then the medium backhitched again for each ERP retry on the next data set, etc. For example, if an ERP retry lasts for three seconds and the proposed reconstructive ERP method uses two retries (backhitch and then reread of the data sets) to recover the error, then the elapsed time for recovery is 3*2=6 seconds. In a case where ten data sets also require error recovery (for the same error or different errors), then 10*3*2=60 seconds are elapsed in order to recover the errors if ERP is attempted for each of the ten data sets using a conventional ERP method. If using the proposed reconstructive ERP attempts to read multiple data sets at the same time (10 data sets are read at the same time), the elapsed time to recover the ten datasets is still 3*2=6 seconds, because there is no difference in elapsed time to read one data set and the ten data sets at the same time on the drive. Most of the time that elapses during a read is due to backhitching the medium. For a tape medium, backhitching is where the tape motion is reversed in order to reread back to the same tape position, which takes about three seconds, but the elapsed time to read data itself is about 0.0x seconds (with x being anywhere from 1 to 9). Due to this reconstructive ERP method, the elapsed time for an error burst situation is reduced to about $\frac{1}{10}$ that of a conventional method, e.g., the elapsed time for the reconstructive ERP method equals about the inverse of the number of multiple data sets to be read ($\frac{1}{10}$ in this example).

Figure 3A:
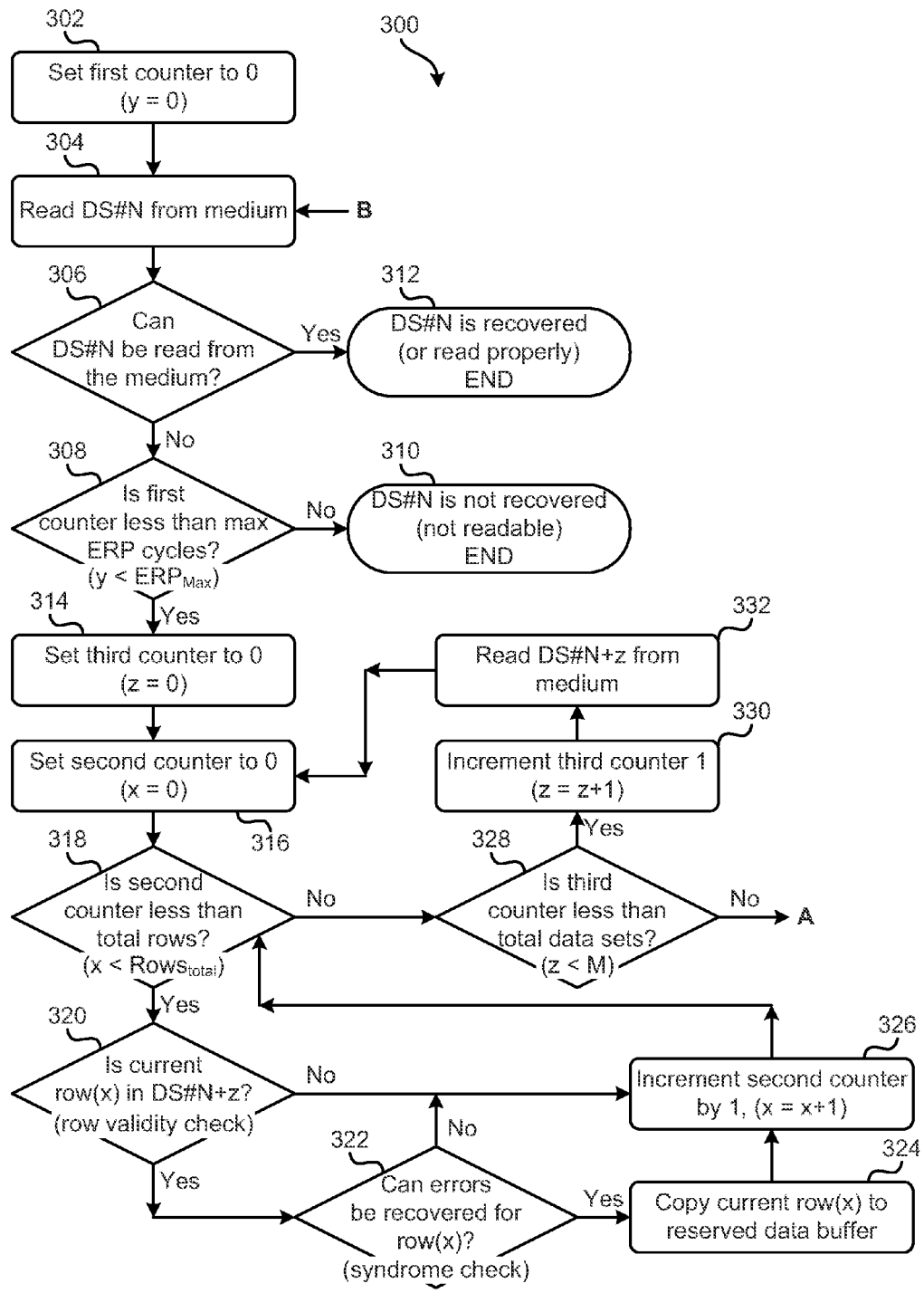
FIGS. 3A-3B show a method for reading data from a medium using a reconstructive error recovery procedure (ERP) for multiple data sets, according to one embodiment.
Figure 3B:
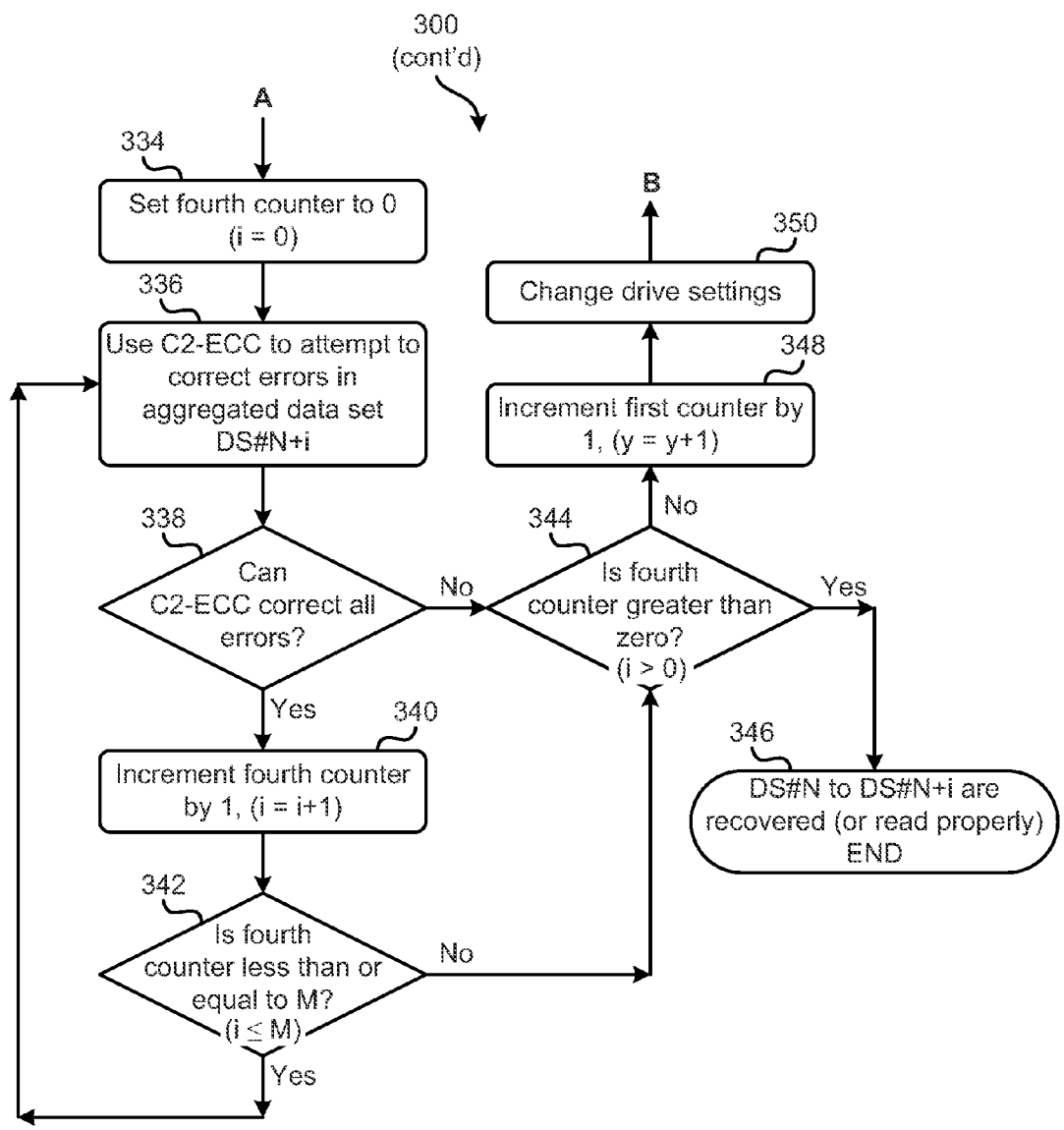

Now referring to FIGS. 3A-3B, a method 300 for multiple data set reconstructive ERP is shown according to one embodiment. The method 300 may be performed in accordance with the present invention in any of the environments depicted in FIGS. 1-2B, among others, in various embodiments. Of course, more or less operations than those specifically described in FIGS. 3A-3B may be included in method 300, as would be understood by one of skill in the art upon reading the present descriptions.

Referring now to FIG. 3A, in operation 302, a first counter (represented by y) is set to zero (y=0). This first counter may be used to count a number of rereads of the initial error data set, along with one or more of a plurality of subsequent data sets from the medium at the same time.

In operation 304, the initial error data set (DS#N) is read from the medium followed by reading a plurality of subsequent data sets. For each subsequent reread, the same data set (DS#N) is read from the medium, but it is read using different settings that also apply to the plurality of data sets read in the same forward motion. DS#N may be at a beginning of the medium, somewhere in the middle, or at an end of the medium. The initial error DS#N will be reread until a maximum allowable number of data set reads ($ERP_{max}$) is reached or until DS#N can be reconstructed correctly, whichever occurs first.

In operation 306, it is determined if the initial error data set DS#N can be read from the medium, which indicates that there are no errors in the data set. If so, then the method 300 continues on to operation 312 and ends. In operation 312, the method 300 ends with the data set being recovered. In one approach, the data set may be sent to the host. Otherwise, when the data set cannot be read without errors, the method 300 continues to operation 308.

In operation 308, it is determined if the first counter is less than the maximum allowable number of data set reads (ERP cycles), e.g., $y<ERP_{max}$. If the first counter equals the maximum allowable number of data set reads, as shown in operation 310, the data set DS#N is not recovered, not readable, and the method ends. In one approach, the host may be informed of the failed data set read.

When the first counter is less than the maximum allowable number of data set reads ($ERP_{max}$), in operation 314, a third counter is set to 0 (z=0) which can be used to count the maximum number of data sets to be read in the same forward read retry motion. The method 300 continues on to operation 316, where a second counter is set to 0 (x=0) which can be used to count the total rows of the data set array. Then, the method 300 continues on to operation 318.

In operation 318, it is determined if the second counter is less than the total rows in the data set array, e.g., $x<Rows_{total}$ for DS#N. If so, the method 300 continues on to operation 320; otherwise, the method continues on to operation 328.

In optional operation 320, it is determined if the current row, row(x), belongs to the initial error data set (DS#N) using a validity check. If the row does belong to the initial error data set, the method 300 continues on to operation 322; otherwise, the method continues on to operation 326.

Figure 6:
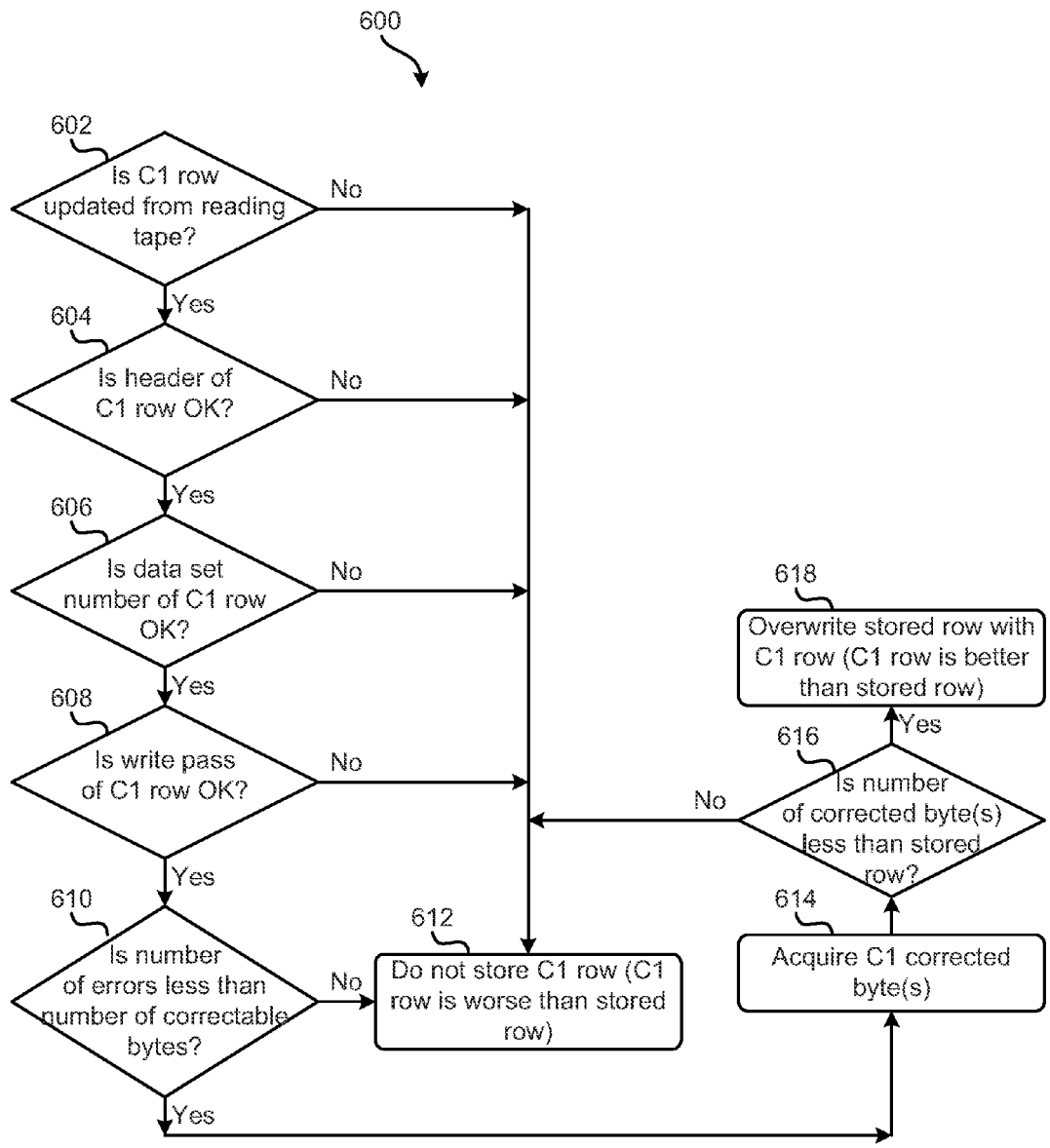
FIG. 6 shows a method, according to one embodiment.

In operation 322, it is determined if errors in the current row can be recovered using C1-ECC of the row in a process referred to as a syndrome check, which is described in more detail in reference to FIG. 6. With continued reference to FIG. 3A, if errors in the current row can be recovered, the method 300 continues on to operation 324; otherwise, the method continues on to operation 326.

In operation 324, the current row is copied and stored to the reserved data buffer to be assembled into the entire data set after all rows have been stored thereto and have only recoverable error therein.

In operation 326, the second counter is incremented by one, e.g., x=x+1. This causes the next instance of operations 316-324 to be performed on the next row of the data set.

In operation 328, it is determined if the third counter is less than a total number of data sets being read subsequent to the initial error data set (M), e.g., z<M. If the third counter is less than the total number of data sets being read in the same forward motion following the initial error data set, then more data set rows need to be checked, and the third counter is incremented by one in operation 330, e.g., z=z+1. Then, the method 300 continues on to operation 332, where the next data set, DS#N+z, is read from the medium, and the method 300 continues to operation 316 to reset the second counter.

When the third counter is equal to (or greater than) the total number of data sets being read in the same forward motion following the initial error data set (M), the method 300 continues to pointer A, which is described in FIG. 3B.

Now referring to FIG. 3B, from pointer A, the method 300 continues to operation 334, where a fourth counter is set to 0, e.g., i=0 which may be used to count from the initial error data set to the first unrecoverable data set in the plurality of data sets read in the same forward motion or to the last data set in that plurality when all were read successfully. Then, in operation 336, C2-ECC is used to attempt to correct all errors in the aggregated data set DS#N+i, since all rows in the data set have now been stored to the reserved data buffer. In the first iteration, where i=0, data set DS#N, the initial error data set, is being checked.

In operation 338, it is determined if all errors in the data set DS#N+i can be recovered using C2-ECC. If so, the method 300 continues on to operation 340; otherwise, the method continues on to operation 344.

In operation 340, the fourth counter is incremented by one, e.g., i=i+1. Then, in operation 342, it is determined if the fourth counter is less than or equal to the total number of data sets being read (M), e.g., i≤M. When the fourth counter is less than or equal to the total number of data sets being read, the method 300 loops back to operation 336 to check the next data set.

When the total number of data sets have been checked, the method 300 continues to operation 344 where it is determined if the fourth counter is greater than zero, e.g., i≥0. If so, then, as shown in operation 346, the initial error data set as well as at least one more in the plurality of data sets read in the same forward motion have been recovered (had errors therein corrected) or have been read properly, and the method 300 ends.

Otherwise, as shown in operation 348, the first counter is incremented by one, e.g., y=y+1, and the method 300 continues to operation 350, where the drive settings are changed in order to try to reread the initial error data set and the plurality of subsequent data set(s) with fewer errors (or at least some rows of one or more of the data sets which previously have not been read with correctable error).

After operation 350, the method 300 continues to pointer B and returns to FIG. 3A to continue to operation 304 again.

According to method 300, less rereads across the plurality of data sets may be required in order to move correctable data from tape to the reserved data buffer because it is not required to perform conventional ERP recovery on each data set in sequence. Successful ERP recovery on the initial error dataset can simultaneously pre-populate the reserved data buffer areas of a plurality of subsequent datasets with sufficient good C1 rows to allow successful C2-verification following data set reconstruction without further tape motion.

Figure 4:
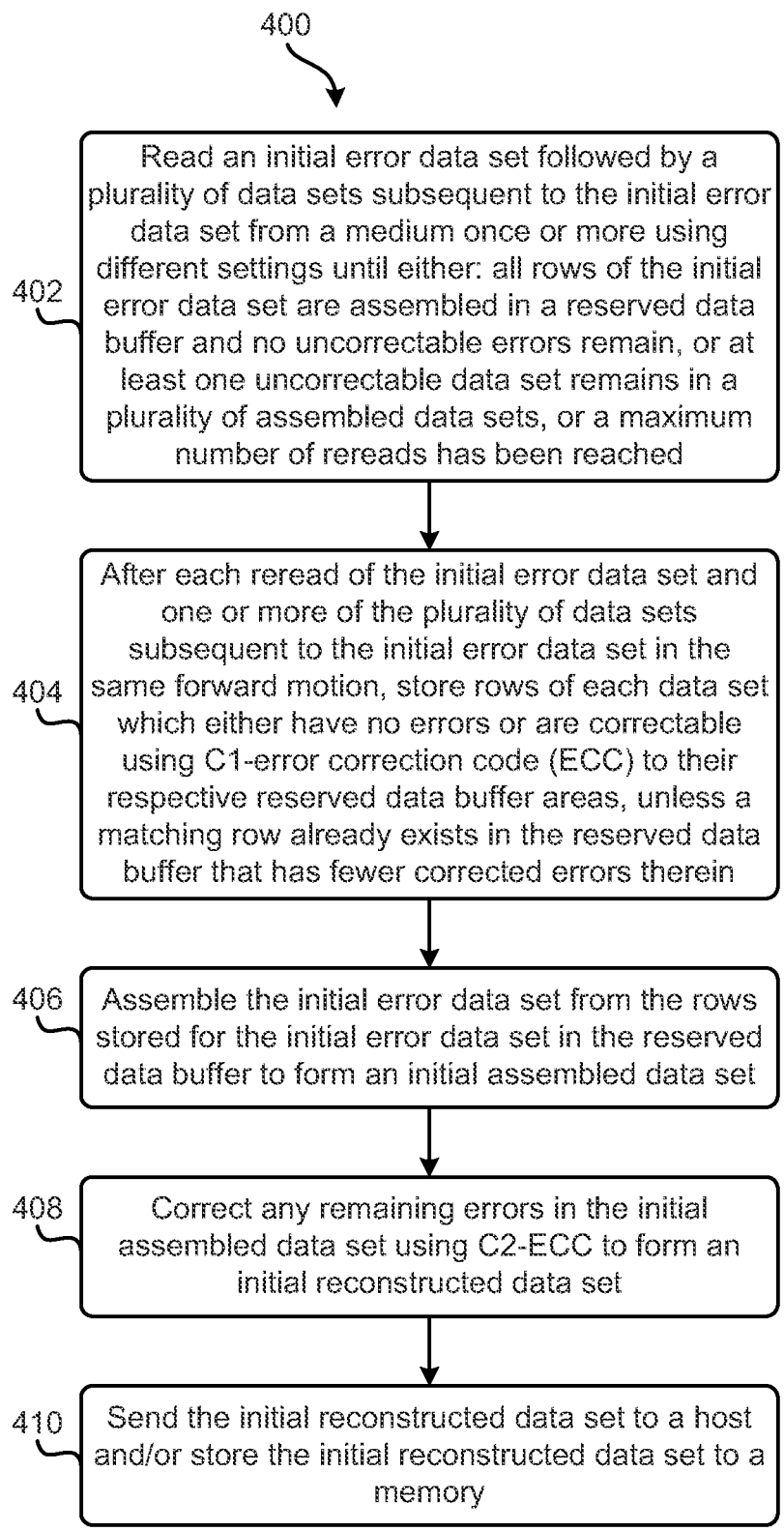
FIG. 4 shows a method for reading data from a medium using a reconstructive ERP for multiple data sets, according to one embodiment.

Now referring to FIG. 4, a method 400 for reading data from a medium using reconstructive ERP for multiple data sets is shown according to one embodiment. The method 400 may be performed in accordance with the present invention in any of the environments depicted in FIGS. 1-3, among others, in various embodiments. Of course, more or less operations than those specifically described in FIG. 4 may be included in method 400, as would be understood by one of skill in the art upon reading the present descriptions.

Each of the steps of the method 400 may be performed by any suitable component of the operating environment. For example, in various non-limiting embodiments, the method 400 may be partially or entirely performed by a C1/C2 decoding system, a tape drive, a hard disk drive, an optical drive, a controller, a processor (such as a CPU, an ASIC, a FPGA, etc.) which may be embedded in and/or operate within a system, etc.

As shown in FIG. 4, method 400 may initiate with operation 402, where an initial error data set followed by a plurality of data sets is read from a medium once and possibly more times using different settings until either: all rows of the initial error data set are assembled in a reserved data buffer and no uncorrectable errors remain, or at least one uncorrectable data set remains in a plurality of assembled data sets, or a maximum number of rereads has been reached (ERP is ended).

The different settings may comprise a change to any suitable setting, such as any of the following: a medium speed during reading, a data flow correction power, channel parameters, servo tracking, etc.

The maximum number of rereads may be a hardware setting of a drive, a predetermined number based on past attempts, a user setting, or a number derived through any other method known in the art. In another embodiment, the number may be a dynamic parameter associated with or based on some aspect of the rereads, such as a marginal improvement in data read, a length of time expended on rereads, a data set's importance, etc.

In one embodiment, the medium may be a magnetic tape, and the method 400 may be performed by a tape drive.

In one embodiment, the reading the plurality of data sets more times further includes reading all data sets subsequent to and including an initial uncorrected data set from the medium. The initial uncorrected data set, according to one embodiment, has an error that is not correctable using C2-ECC or an error in any row that is not correctable using C1-ECC.

In operation 404, after each reread of the initial error data set and one or more of the plurality of data sets subsequent to the initial error data set in the same forward motion, rows of each data set which have no errors or have errors in each row that are correctable using C1-ECC are stored to their respective reserved data buffer areas, unless a matching row already exists in the reserved data buffer that has fewer corrected errors therein. A matching row is a row which is positioned in the same location in the data set array. For example, if row 1 of the data set (which has three corrected errors therein) is already stored in the reserved data buffer, and row 1 is read again using different settings and has only two corrected errors therein, then the stored row 1 is overwritten by the reread row 1.

In one approach, all rows of the plurality of data sets may be copied to their respective reserved data buffer areas after a first reading of the plurality of data sets from the medium so that the entirety of each of the data sets is stored to the reserved data buffer (in their respective areas), then in subsequent reads, any row of any data set may be improved (e.g., fewer corrected errors in each row).

According to one embodiment, each row may comprise a C1-encoded row in an array representing a data set.

In operation 406, the initial error data set is assembled from the rows stored for the initial error data set in the reserved data buffer to form an initial assembled data set. Furthermore, as needed or optionally, each of the plurality of data sets subsequent to the initial error data set may be assembled from the rows stored for each data set in the reserved data buffer to form a plurality of assembled data sets, as long as a sufficient rows are available for the subsequent data sets. Each assembled data set comprises only rows which are C1-ECC correctable, thereby providing complete data sets which have rows where all errors in each row are correctable.

In operation 408, any remaining errors in the initial assembled data set are corrected using C2-ECC to form an initial reconstructed data set. Furthermore, if possible, any remaining errors in the plurality of assembled data sets are corrected using C2-ECC to form a plurality of reconstructed data sets. In this way, no more errors are present in the reconstructed data sets or the errors that may remain in the plurality of reconstructed data sets at a time when the initial error data set has been recovered (reconstructed) cannot be corrected.

In operation 410, the initial reconstructed data set is sent to a host and/or to a memory, such as in a tape drive, server, etc. Furthermore, when available, the plurality of reconstructed data sets are also sent to the host and/or stored to the memory. The first data set within the plurality of data sets which cannot be read correctly becomes the starting point for the next recovery session.

Figure 5:
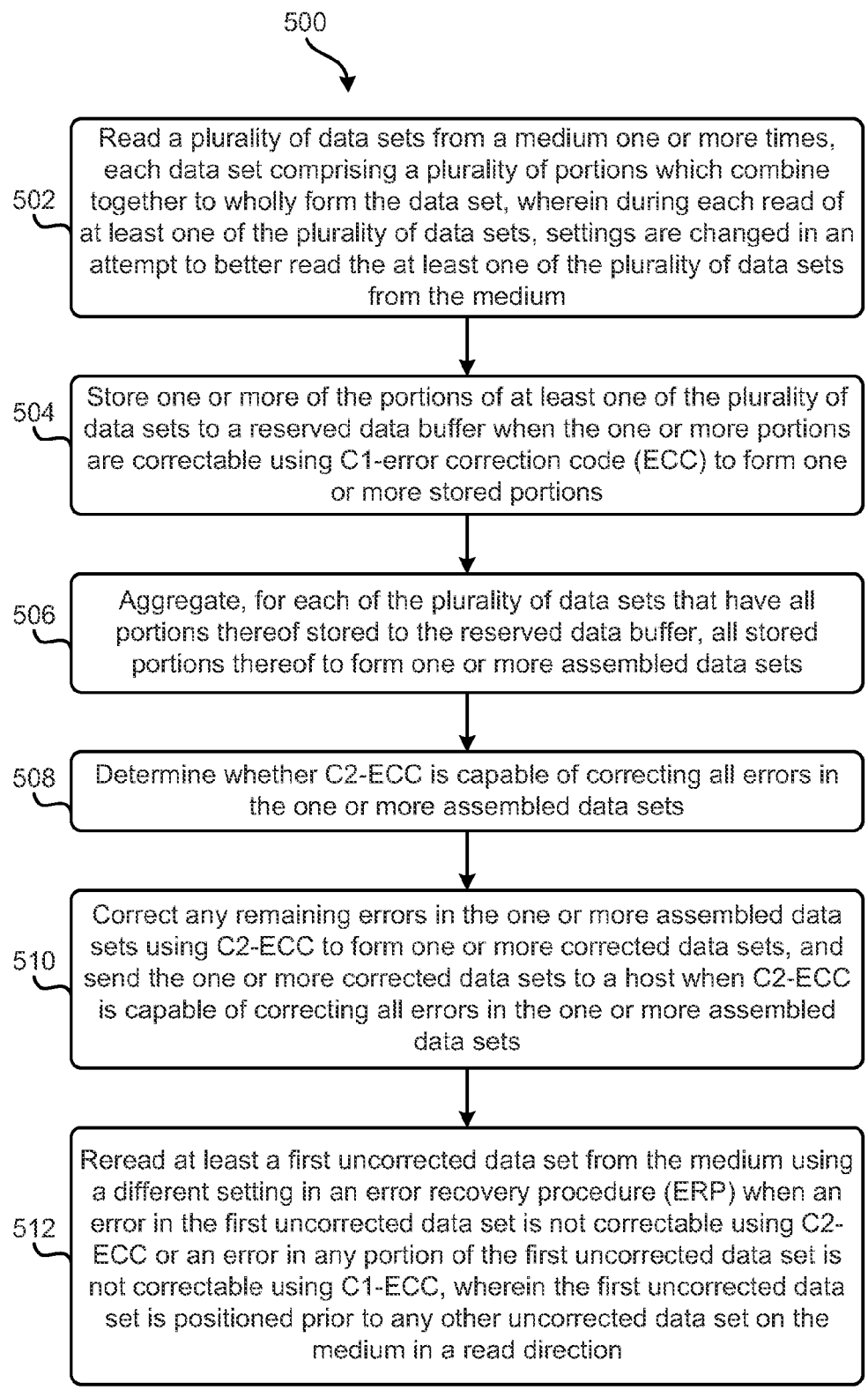
FIG. 5 shows a method for reading data from a medium using a reconstructive ERP for multiple data sets, according to one embodiment.

Now referring to FIG. 5, a method 500 for reading data from a medium using reconstructive ERP for multiple data sets is shown according to one embodiment. According to a further embodiment, when certain criteria have been met (e.g., detection of an error burst or particular cartridge type) then a reconstructive data recovery method may be applied to multiple data sets in a single read (e.g., all read at the same time during one ERP session, in a single action, in the same forward motion, etc.). The method 500 may be performed in accordance with the present invention in any of the environments depicted in FIGS. 1-3, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various non-limiting embodiments, the method 500 may be partially or entirely performed by a C1/C2 decoding system, a tape drive, a hard disk drive, an optical drive, a controller, a processor (such as a CPU, an ASIC, a FPGA, etc.) which may be embedded in and/or operate within a system, etc.

As shown in FIG. 5, method 500 may initiate with operation 502, where a plurality of data sets are read from a medium one or more times, each data set comprising a plurality of portions which combine together to wholly form the data set. Also, during each read of at least one of the plurality of data sets, settings are changed in an attempt to better read the at least one of the plurality of data sets from the medium. Each portion may be any part of the data set, and the data set may be represented by any structure. By better read, what is meant is that less errors are encountered in the read data set by adjusting the settings used to read the data set from the medium.

The different settings may comprise a change to any suitable setting, such as any of the following: a medium speed during reading, a data flow correction power, channel parameters, servo tracking, etc.

In one embodiment, each portion may be a row in an array representing the data set, as described in more detail herein. Specifically, each portion may be a C1-encoded row in an array representing a data set. Furthermore, each row of the array may comprise a header along with data encoded and interleaved into C1 codewords therein. In another embodiment, each portion may be a column in the array, in which the C1 steps are switched with C2 steps.

In optional operation 504, one or more of the portions of at least one of the plurality of data sets are stored to a reserved data buffer when the one or more portions are correctable using C1-ECC to form one or more stored portions. In this way, the correctable portions of the data sets are stored to the reserved data buffer in their entirety, and portions may be overwritten when they are better than a portion already stored to the reserved data buffer.

The reserved data buffer may be part of a larger data buffer of a medium drive, such as a tape drive when the medium is a tape, or it may be a separate, dedicated memory for storage thereto, either in the drive or accessible to the drive used to read the data set.

In operation 506, for each of the plurality of data sets that have all portions thereof stored to the reserved data buffer, all stored portions thereof are aggregated to form one or more assembled data sets. This means that any errors present in the portion may be corrected using the C1-encoding of the portion, without relying on any C2-encoding of the data set. Should the portion not be correctable using C1-encoding, the portion is not stored to the reserved data buffer.

In one embodiment, when a portion already exists in the reserved data buffer that matches a read portion that has correctable error therein, the existing portion is overwritten when the corresponding portion from the one or more portions (the read portion that has correctable error therein) has less corrected errors therein than the existing portion. For example, if a stored portion has three corrected errors, and a read portion only has two corrected errors, the read portion will overwrite the stored portion in the reserved data buffer.

In other words, the one or more stored portions may be overwritten when at least one corresponding portion from the one or more portions that are correctable using C1-ECC has less corrected errors therein than the one or more stored portions.

In operation 508, it is determined whether C2-ECC is capable of correcting all errors in the one or more assembled data sets. In this way, after all portions of the one or more assembled data sets have been stored to the reserved data buffer and are correctable using C1-ECC, the entire data set may be reconstructed from "good" portions which have a correctable number of errors therein.

In operation 510, any remaining errors in the one or more assembled data sets are corrected using C2-ECC to form one or more corrected data sets, and the one or more corrected data sets are sent to a host when C2-ECC is capable of correcting all errors in the one or more assembled data sets. In this way, if some errors remain in the data set after assembling the portions together to form the entire data set, they may be corrected using C2-encoding across the portions. For example, if the portions are rows, then the C2-encoding is across the columns and may be used to correct any remaining errors.

The rereading the at least first uncorrected data set from the medium may further comprise rereading a number of data sets subsequent to the first uncorrected data set from the medium, according to one embodiment.

In operation 512, at least a first uncorrected data set is reread from the medium using a different setting in an ERP when an error in the first uncorrected data set is not correctable using C2-ECC or an error in any portion of the first uncorrected data set is not correctable using C1-ECC. The first uncorrected data set is positioned prior to any other uncorrected data set on the medium in a read direction. A read direction refers to a logical direction that a medium normally travels during a read operation, such as a forward direction for a tape. When a tape is backhitched, the direction the tape travels during the backhitch is not considered a read direction of the tape. Similarly for a disk, the direction in which the head moves during a read operation while the disk spins is indicated as a read direction, while any other direction that the head moves while searching for a next data set is not considered a read direction.

In one approach, all portions of the plurality of data sets are stored to the reserved data buffer after a first reading of the plurality of data sets from the medium.

According to one embodiment, the method 500 may be repeated until either all corrected data sets are sent to the host, or a number of allowable retries on an initial error data set is reached and it is reported to the host as unreadable. The number of allowable retires may be a hardware setting of a drive, a predetermined number based on past attempts, a user setting, or a number derived through any other method known in the art.

In other words, at least a portion of the plurality of data sets is reread from the medium, and the one or more stored portions in the reserved data buffer is overwritten with portions having fewer errors corrected therein, and it is determined whether C2-ECC is capable of correcting all errors in the one or more assembled data sets until either all corrected data sets are sent to the host, or a number of allowable retries is reached and one or more of the plurality of data sets is reported to the host as unreadable.

In one approach, the medium may be a magnetic tape, and the method 500 may be performed by a tape drive.

Now referring to FIG. 6, the syndrome check is explained in more detail. When data is read from the medium, in the form of a data set, the data set is transferred to the drive buffer. Each row of the data set includes at least the following information: header information, write pass number, data set number, indicator for uncorrected or corrected status, and corrected bytes of C1-encoding. Using the above information, in one embodiment, the drive is capable of verifying that a currently read row is better than a previously stored row in the reserved data buffer. This process may be as shown in FIG. 6, or performed in any other way known in the art.

In FIG. 6, the method 600 begins with operation 602, where it is determined if the C1 row (the current row read from the data set for the remainder of the description of method 600) has been updated after reading the data set from tape. That is to say, during some data set reads, a particular row may not be readable, and if it is not, then method 600 ends at operation 612 because there is no row to compare.

In operation 604, it is determined if the header of the C1 row is acceptable. Each row has header information, and this header information helps to determine if the correct row is stored to the buffer. If not, the method ends at operation 612.

In operation 606, it is determined if the data set number is acceptable for the C1 row. The data set number is assigned from the beginning of the medium, such as 0 to N. The drive has knowledge of which data set is being manipulated in the buffer, and it is determined if the data set number of the C1 row is the same as that in the buffer. If not, the method ends at operation 612.

In operation 608, it is determined if the write pass of the C1 row is acceptable. Write pass is information which indicates the generation of the data set on the medium. If the data set number is the same, the data set which has a higher write pass is newer, making it the valid data set. Since the drive has knowledge of the write pass of the target data set, if the write pass number of the C1 row is less than the stored data set, the C1 row is discarded as being older and the method ends at operation 612.

In operation 610, it is determined if the number of errors in the C1 row is less than a maximum number of correctable errors, which is determined by the C1-encoding of the row in the data set. This is often referred to as a syndrome check. If not, the method ends at operation 612.

In operation 612, the C1 row is not stored to the buffer and the method 600 ends because the C1 row is worse than the row currently stored to the buffer.

In operation 614, the C1 corrected byte or bytes are acquired based on the C1-encoding to correct errors in the C1 row.

In operation 616, it is determined if the number of corrected byte(s) for the C1 row is less than the number of corrected byte(s) for the stored row. If so, the method 600 continues to method 618 where the C1 row is stored to the buffer (and possibly overwrites a current row in the buffer corresponding to the C1 row). If not, the method ends at operation 612.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system for reading data from a medium, the system comprising:
a processor and logic that is integrated with the processor, executable by the processor, or integrated with and executable by the processor, the logic causing the processor to:
read a plurality of data sets, each data set comprising a plurality of portions which combine together to wholly form the data set;
store one or more of the portions of at least one of the plurality of data sets to a reserved data buffer in response to a determination that the one or more of the portions have no errors or are correctable using C1-ECC to form one or more stored portions, unless a matching portion already exists in the reserved data buffer that has fewer corrected errors therein to avoid one or more additional backhitches to reread the one or more stored portions;
reread at least a first uncorrected data set using a different setting in an error recovery procedure (ERP) in response to a determination that an error in the first uncorrected data set is not correctable using C2-error correction code (ECC) or an error in any portion of the first uncorrected data set is not correctable using C1-ECC; and
output each data set in response to a determination that no errors exist therein or in response to correcting at least some errors therein.

2. The system as recited in claim 1, wherein the logic further causes the processor to:
aggregate, for each of the plurality of data sets that have all portions thereof stored to the reserved data buffer, all stored portions thereof to form one or more assembled data sets;
determine whether C2-ECC is capable of correcting all errors in the one or more assembled data sets; and
correct any remaining errors in the one or more assembled data sets using C2-ECC to form one or more corrected data sets, and
wherein the logic configured to output each data set is further configured to send the one or more corrected data sets to a host in response to a determination that C2-ECC is capable of correcting all errors in the one or more assembled data sets.

3. The system as recited in claim 2, wherein the one or more stored portions is overwritten in response to a determination that at least one corresponding portion from the one or more portions that are correctable using C1-ECC has fewer corrected errors therein than the one or more stored portions.

4. The system as recited in claim 3, wherein at least a portion of the plurality of data sets is reread, the one or more stored portions in the reserved data buffer is overwritten with portions having less errors corrected therein, and it is determined whether C2-ECC is capable of correcting all errors in the one or more assembled data sets until either all corrected data sets are sent to the host, or until a number of allowable retries is reached and one of the plurality of data sets is reported to the host as unreadable.

5. The system as recited in claim 1, wherein the first uncorrected data set is positioned prior to any other uncorrected data set in a read direction, wherein the data sets are read from a magnetic tape, and wherein different settings comprise a change to at least one of: a tape speed during reading, a data flow correction power, channel parameters, and servo tracking.

6. The system as recited in claim 1, wherein the logic further causes the processor to reread all data sets subsequent to the first uncorrected data set.

7. The system as recited in claim 1, wherein the logic further causes the processor to store all portions of the plurality of data sets to the reserved data buffer after a first reading of the plurality of data sets.

8. The system as recited in claim 1, wherein each portion is a C1-encoded row in an array representing a data set.

9. A tape drive, comprising:
a data buffer comprising a reserved data buffer;
a processor configured to execute logic, the logic being configured to cause the processor to:
read an initial error data set followed by a plurality of data sets subsequent to the initial error data set once or more using different settings until:
all rows of the initial error data set are assembled in a reserved data buffer and no uncorrectable errors remain, or
at least one uncorrectable data set remains in a plurality of assembled data sets, or
a maximum number of rereads has been reached;
after each rereading of the initial error data set and one or more of the plurality of data sets subsequent to the initial error data set in the same forward motion, store rows of each data set which either have no errors or are correctable using C1-error correction code (ECC) to their respective reserved data buffer areas, unless a matching row already exists in the reserved data buffer that has fewer corrected errors therein to avoid one or more additional backhitches to reread the rows which either have no errors or are correctable using C1-ECC; and output each data set in response to a determination that no errors exist therein or in response to correcting at least some errors therein.

10. The tape drive as recited in claim 9, wherein the logic is further configured to cause the processor to:

assemble the initial error data set from the rows stored for the initial error data set in the reserved data buffer to form an initial assembled data set; and correct any remaining errors in the initial assembled data set using C2-ECC to form an initial reconstructed data set, and wherein the logic configured to output each data set is further configured to send the initial reconstructed data set to a host and/or store the initial reconstructed data set to a memory.

11. The tape drive as recited in claim 9, wherein the logic is further configured to cause the processor to read all data sets subsequent to and including a first uncorrected data set, wherein the first uncorrected data set has an error that is not correctable using C2-ECC or an error in any row that is not correctable using C1-ECC.

12. The tape drive as recited in claim 9, wherein the logic is further configured to cause the processor to copy all rows of the plurality of data sets to their respective reserved data buffer areas after a first reading of the plurality of data sets.

13. The tape drive as recited in claim 9, wherein the initial error data set and the data sets are read from a magnetic tape.

14. The tape drive as recited in claim 9, wherein the different settings comprise a change to at least one of: a medium speed during reading, a data flow correction power, channel parameters, and servo tracking.

15. A method for reading data, the method comprising:

reading a plurality of data sets, each data set comprising a plurality of portions which combine together to wholly form the data set;

storing one or more of the portions of at least one of the plurality of data sets to a reserved data buffer in response to a determination that the one or more of the portions have no errors or are correctable using C1-ECC to form one or more stored portions, unless a matching portion already exists in the reserved data buffer that has fewer corrected errors therein to avoid one or more additional backhitches to reread the one or more stored portions;

rereading at least a first uncorrected data set using a different setting in an error recovery procedure (ERP) in response to a determination that an error in the first uncorrected data set is not correctable using C2-error correction code (ECC) or an error in any portion of the first uncorrected data set is not correctable using C1-ECC, wherein the first uncorrected data set is positioned prior to any other uncorrected data set in a read direction; and outputting each data set in response to a determination that no errors exist therein or in response to correcting at least some errors therein.

16. The method as recited in claim 15, further comprising:

aggregating, for each of the plurality of data sets that have all portions thereof stored to the reserved data buffer, all stored portions thereof to form one or more assembled data sets;

determining whether C2-ECC is capable of correcting all errors in the one or more assembled data sets; and correcting any remaining errors in the one or more assembled data sets using C2-ECC to form one or more corrected data sets, wherein the outputting each data set comprises sending the one or more corrected data sets to a host in response to a determination that C2-ECC is capable of correcting all errors in the one or more assembled data sets.

17. The method as recited in claim 15, wherein the rereading at least the first uncorrected data set further comprises rereading all data sets subsequent to the first uncorrected data set.

18. The method as recited in claim 15, further comprising storing all portions of the plurality of data sets to the reserved data buffer after a first reading of the plurality of data sets, wherein each portion is a C1-encoded row in an array representing a data set.

19. The method as recited in claim 15, wherein the one or more stored portions is overwritten in response to a determination that at least one corresponding portion from the one or more portions that are correctable using C1-ECC has less corrected errors therein than the one or more stored portions, and wherein the different settings comprise a change to at least one of: a medium speed during reading, a data flow correction power, channel parameters, and servo tracking.

20. A computer program product for reading data, the computer program product comprising a computer readable storage medium having program instructions embodied therewith, the program instructions executable by a processor to cause the processor to perform the method of claim 16.

* * * * *